United States Patent [19]
Murphy

[11] Patent Number: 5,909,129
[45] Date of Patent: Jun. 1, 1999

[54] LOW COST MICROSTRIP PHASE DETECTOR

[75] Inventor: Kevin Murphy, Palmyra, Mo.

[73] Assignee: Glenayre Electronics, Inc., Charlotte, N.C.

[21] Appl. No.: 08/864,662

[22] Filed: May 28, 1997

[51] Int. Cl.$^6$ .............................. H01P 5/12; H03D 13/00
[52] U.S. Cl. .................... 327/3; 327/2; 327/8; 327/350; 327/100; 327/244; 333/136
[58] Field of Search .................... 327/1, 2, 3, 7, 327/350, 8, 39, 40, 47, 156, 147, 100, 256, 244; 333/125, 127, 128, 136, 161; 455/323, 325

[56] References Cited

FOREIGN PATENT DOCUMENTS 356090637  7/1981  Japan ........................................ 327/3

*Primary Examiner*—Dinh Le
*Attorney, Agent, or Firm*—Christensen O'Connor Johnson & Kindness PLLC

[57] ABSTRACT

A low-cost microstrip phase detector that is photo-etched onto a circuit board is disclosed. The phase detector is used to detect the phase difference between two high-power radio frequency (RF) signals. One RF signal enters a delay line causing the signal to experience a 180° phase shift. The other RF signal is not phase shifted. Both RF signals are then input into a Wilkinson combiner circuit. The structure of the Wilkinson combiner is such that there is no voltage output from the combiner when the two input signals are exactly 180° out of phase. When the original signals (before the delay line) are in-phase, there is no voltage output from the combiner. However, when the original signals are out-of-phase to begin with, they do not enter the Wilkinson combiner with a 180° phase difference. Instead, the phase difference is greater than or less than 180°, depending on whether one input signal leads or lags the other input signal. The signals are not fully dissipated in the balancing resistors, but produce a resultant output voltage from the combiner. This output voltage is proportional to the phase difference and amplitude of the input RF signals. The output of the Wilkinson combiner is connected to a Schottky diode detector circuit that provides a DC output voltage indicative of the phase difference between the input RF signals. The output DC signal is then provided to a digital microcontroller.

6 Claims, 1 Drawing Sheet

LOW COST MICROSTRIP PHASE DETECTOR

FIELD OF THE INVENTION

The present invention relates generally to radio frequency (RF) electronic amplifier circuits and, more particularly, to a low cost phase detector used to ensure that parallel RF power inputs are matched in phase.

BACKGROUND OF THE INVENTION

All radio frequency transmitters employ amplifiers that boost the power of a desired signal from a relatively low level to a higher level. The output signals of the amplifiers are generally fed to an antenna system that broadcasts the RF signals to one or more remotely located receivers. For very high-power applications, radio frequency amplifiers still use vacuum tubes as the active elements for boosting the power of the radio frequency signals. However, for lower power applications, most amplifiers use solid state devices such as field effect transistors (FETs).

A common RF amplifier design uses only a single power FET in its output stage so that the amplifier is stable, i.e., free from oscillation, over a wide range of frequencies. However, amplifiers using only a single power FET are limited in the power levels they can produce. In order to increase the power rating of the amplifier, some RF amplifiers use two or more power FETs that are connected in parallel. Because each FET contributes only a portion of the total power, the combined power can be increased without damaging the individual devices. Such parallel high-power RF FET amplifier circuits are therefore generally more reliable than single transistor designs.

Thus, it is important to be able combine separate power sources. One well known prior art method is the Wilkinson combiner. Another prior art combiner is shown in U.S. Pat. No. 5,455,546 to Frederick et al. and assigned to the same assignee herein. Another improvement of a power combiner is disclosed in co-pending U.S. patent application Ser. No. 08/601,370 filed Feb. 14, 1996 entitled "High-Power Amplifier Using Parallel Transistors", assigned to the same assignee herein and hereby incorporated by reference in its entirety. In each of these combiners, it is important that the parallel power inputs be matched in phase.

One prior art method of constructing an RF phase detector is to use a double balanced mixer (DBM). Since each input is the exact same frequency, the output from the DBM will be a DC voltage proportional to the phase difference. The cost of a DBM in some applications can be relatively high. Thus, there is a need for a low cost phase detector.

SUMMARY OF THE INVENTION

A low-cost microstrip phase detector that is photo-etched onto a circuit board is disclosed. The phase detector is used to detect the phase difference between two high-power radio frequency (RF) signals. One RF signal enters a delay line causing the signal to experience a 180° phase shift. The other RF signal is not phase shifted. Both RF signals are then input into a Wilkinson combiner circuit. The structure of the Wilkinson combiner is such that there is no voltage output from the combiner when the two input signals are exactly 180° out of phase. When the original signals (before the delay line) are in-phase, there is no voltage output from the combiner. However, when the original signals are out-of-phase to begin with, they do not enter the Wilkinson combiner with a 180° phase difference. Instead, the phase difference is greater than or less than 180°, depending on whether one input signal leads or lags the other input signal. The signals are not fully dissipated in the balancing resistors, but produce a resultant output voltage from the combiner. This output voltage is proportional to the phase difference and amplitude of the input RF signals. The output of the Wilkinson combiner is connected to a Schottky diode detector circuit that provides a DC output voltage indicative of the phase difference between the input RF signals. The output DC signal is then provided to a digital microcontroller.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
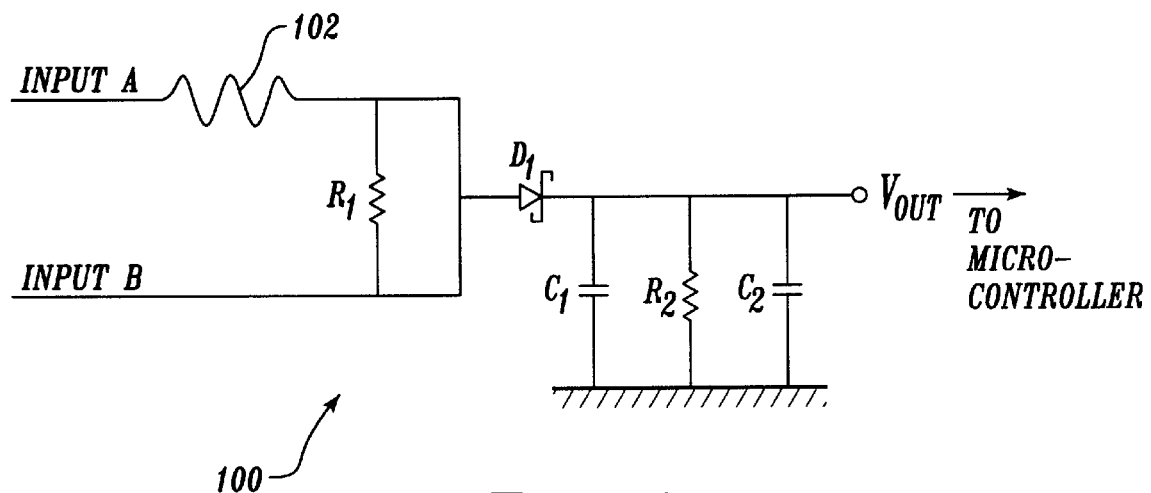
FIG. 1 is a circuit diagram of a phase detector formed in accordance with the present invention.
Figure 2:
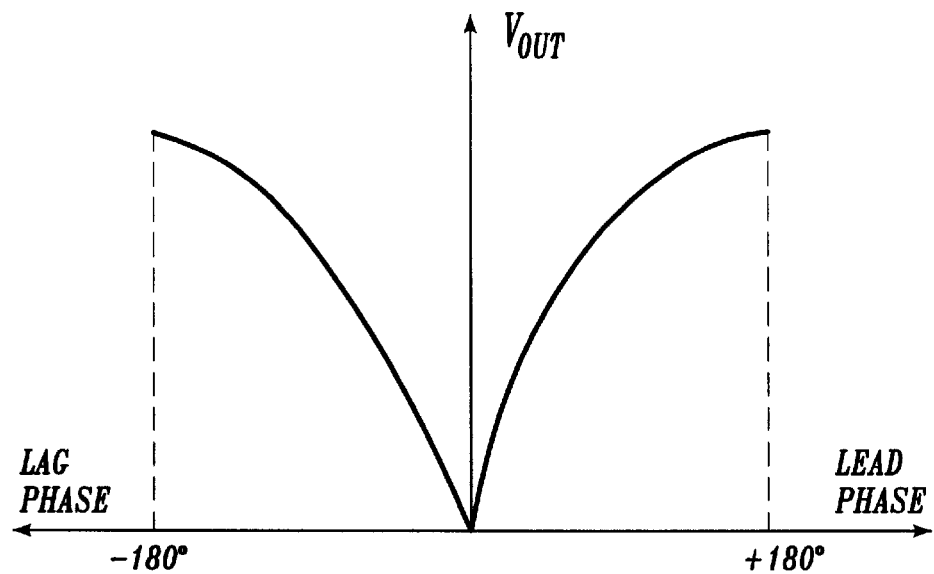
FIG. 2 is a graph illustrating the relationship between $V_{OUT}$ and the phase difference between the two RF input signals.

FIG. 1 shows in schematic format a phase detector 100 formed in accordance with the present invention. The phase detector 100 includes a delay line 102, resistor $R_1$, Schottky diode $D_1$, capacitor $C_1$, resistor $R_2$, and capacitor $C_2$. The phase detector receives as input two RF input signals: Input A and Input B. These RF input signals are "tapped" from the actual RF output signals provided by the parallel power FETs. The phase detector provides an output $V_{OUT}$ that is indicative of the relative phase difference between Input A and Input B. The $V_{OUT}$ output is provided to a microcontroller for use in adjusting the RF amplifier system. FIG. 2 shows in graphical format the relationship between $V_{OUT}$ and the relative phase difference between the two inputs to the phase detector 100.

As seen in FIG. 1, Input A is provided to delay line 102. After delay line 102, Input A is provided as one input of the Wilkinson structure formed by resistor $R_1$. The other input to the Wilkinson structure is Input B, which is provided directly to the Wilkinson structure. It should be noted that the propagation time for Input A and Input B to the Wilkinson structure differ exactly by one-half of a cycle. This difference is implemented by the delay line 102. Further, delay line 102 will vary according to the frequency of the RF signal.

The output side of the Wilkinson structure is input into Schottky diode $D_1$. The output of Schottky diode $D_1$, $V_{OUT}$, is then input to a microcontroller for adjusting the actual phase of the RF input signals provided to the parallel power FETs. As further detailed below, the resistor $R_2$ and capacitors $C_1$ and $C_2$ act as a filter.

In the preferred embodiment, all of the components of FIG. 1 leading up to the Schottky diode $D_1$ are formed as microstrip lines on a printed circuit board. The input impedance of the microstrip transmission lines is nominally 100 ohms. Moreover, in one actual embodiment, the value of resistor $R_1$ is 200 ohms, the value of resistor $R_2$ is 1000 ohms, the value of capacitor $C_1$ is 33 picofarads, and the value of capacitor $C_2$ is 0.1 microfarads.

By using a 100 ohm impedance for the microstrip transmission lines, two advantages are obtained. First, for a given thickness of dielectric material, the width of the microstrip line determines its impedance. Generally, the higher the impedance, the thinner the microstrip line. Further, by having a thinner microstrip line, it is easier to meander the microstrip line into a smaller area, improving the usefulness of the present invention. Second, by having a higher input impedance, the input signal to the Schottky diode $D_1$ will have a higher voltage to current ration RF signal, thereby improving detector sensitivity.

As noted above, the delay line 102 is simply a signal propagation line that is of precise length for the frequency of the RF input signals to delay the signal for 180°. In other words, the delay line 102 should be equal to one-half of a wavelength for the RF input signal. Wavelength and frequency are related by the well known relationship:

$$c = \lambda f$$

where c is the speed of light, f is the frequency, and $\lambda$ is the wavelength. It can be appreciated that the propagation speed of the RF input signal through the delay line 102 is not exactly equal to the speed of light (c).

Specifically, the velocity of propagation in a medium other than a vacuum with a relative dielectric constant $e_r$ can be described as:

$$v_p = c/(e_r)^{1/2}$$

Therefore, it follows that:

$$\lambda = v_p/f = c/[f(e_r)^{1/2}]$$

Thus, for any frequency of the RF input signal, a corresponding wavelength may be calculated. Then, the length of the delay line 102 is simply one-half of the wavelength. For example, for a 900 MHz RF signal, with a relative dielectric constant $e_r = 2.55$, the wavelength is calculated to be 20.86 cm. Thus, the delay line 102 should be 10.43 cm in length.

The operation of the phase detector 100 will now be described. The input signals, Input A and Input B, are provided to two branches of a Wilkinson combiner. Input A is routed through the delay line 102 while Input B is routed directly through. If Input A and Input B are exactly in phase, then at the resistor $R_1$, Input A and Input B are exactly out of phase. This causes the signals to be dissipated completely across the resistor $R_1$. As previously reported by Wilkinson, $R_1$ appears as two resistors equal to a characteristic $Z_0$ of input, connected in series to a point which then becomes a virtual ground for two equal amplitude inputs. Therefore, the input to the Schottky diode $D_1$ is exactly zero.

However, when Input A and Input B are out of phase, the signals across the resistor $R_1$ are not exactly out of phase and therefore there is a voltage across the resistor $R_1$ and input into the Schottky diode $D_1$. Specifically, the signal across the resistor $R_1$ is a RF signal that is rectified by the Schottky diode $D_1$. In particular, the Schottky diode $D_1$ functions as a half-wave rectifier at the RF frequency. Once the RF signal is rectified, the remainder of the RF signal is filtered by the capacitors $C_1$ and $C_2$. In particular, for a RF signal at 930 MHz, a 33 picofarad capacitor $C_1$ is used. The resistor $R_2$ is the DC current path which the phase error output voltage ($V_{OUT}$) is generated across.

While the present invention has been described with respect to its preferred embodiment, those skilled in the art will recognize that changes can be made. Therefore, it is intended that the scope of the invention be determined solely from the following claims.

What is claimed is:

1. A phase detector for determining a relative phase difference between a first sinusoidal input signal and a second sinusoidal input signal, said first sinusoidal input signal and said second sinusoidal input signal of substantially the same frequency, said phase detector comprising:

(a) a two-input Wilkinson combiner having a first input and a second input, said second sinusoidal input signal provided to said second input;

(b) a delay line connected to the first input of said Wilkinson combiner, said first sinusoidal input signal connected to said delay line, said delay line operative to delay said first sinusoidal input signal by one-half of a cycle; and (c) a Schottky diode electrically connected to an output of said Wilkinson combiner, said Schottky diode providing an output signal indicative of the relative phase difference between said first sinusoidal input signal and said second sinusoidal input signal.

2. The phase detector of claim 1 further including a filter electrically connected to an output of said Schottky diode.

3. The phase detector of claim 1 where said delay line is a microstrip line etched into a printed circuit board.

4. A phase detector for determining a relative phase difference between a first sinusoidal input signal and a second sinusoidal input signal, said phase detector comprising:

(a) a Wilkinson combiner having at least a first input and a second input, said second sinusoidal input signal provided to said second input;

(b) a delay line connected to the first input of said Wilkinson combiner, said first sinusoidal input signal connected to said delay line, said delay line operative to delay said first sinusoidal input signal by one-half of a cycle; and (c) a rectifying means coupled to an output of said Wilkinson combiner, said rectifying means providing an output signal indicative of the relative phase difference between said first sinusoidal input signal and said second sinusoidal input signal.

5. The phase detector of claim 4 further including a filter electrically connected to an output of said rectifying means.

6. The phase detector of claim 4 wherein said rectifying means is a diode.

* * * * *